Oct. 13, 1964

N. GROSSMAN 3,152,388

PRINTED CIRCUIT PROCESSING

Filed March 3, 1958

INVENTOR:
Norman Grossman

By Robert H. Lentz
Attorney

United States Patent Office 3,152,388
Patented Oct. 13, 1964

3,152,388

PRINTED CIRCUIT PROCESSING

Norman Grossman, Los Angeles, Calif., assignor, by mesne assignments, to Litton Industries, Inc., Beverly Hills, Calif., a corporation of Delaware Filed Mar. 3, 1958, Ser. No. 718,858
13 Claims. (Cl. 29—155.5)

This invention relates to printed circuit processing and more particularly to methods and apparatus for dip-soldering printed circuits.

In relatively recent years there has evolved in the electronics art a new technique for packaging electronic circuits by mounting the circuit components upon an insulative board having conductive patterns formed thereon for interconnecting the terminals of the various components. These insulative boards, known alternatively as printed circuit boards or etched circuit boards, are usually manufactured from foil clad sheets of a suitable insulating material, the desired conductive pattern being formed by selectively etching away the foil in the regions between the conductive pattern.

In their most common form printed circuit boards include conductive strips and terminal points on both sides thereof, and either conductive eyelets or plated-through holes interconnecting terminal points on the conductive pattern on one side of the board with terminal points on the conductive pattern on the opposite side of the board. In accordance with the prevailing custom in the electronics art, a special printed circuit board is fabricated for each of the different electronic circuits which is to be packaged as a printed circuit, the conductive patterns on the board and the conductive apertured terminals through the board being located to facilitate the mounting of the various components of the associated circuit and to minimize the number of electrical connections which must be made on the board.

In packaging any particular electronic circuit as a printed circuit, the associated circuit components are first mounted on one side of the board, hereinafter called the front, by passing each component's wires or leads through the associated apertured terminals in the board and clipping them substantially flush with the board on the reverse side thereof. After all of the components have been mounted on the front of the board in the foregoing manner, the board is dip-soldered by placing the board, with its reverse side down, on the surface of a pool of molten solder to thereby solder the component leads to the associated conductive apertured terminals and hence to the associated conductive pattern on the board.

While the above-described dip-soldering process has been employed with a certain degree of success in the manufatcure of printed circuits, there are nevertheless several disadvantages attendant its use. Firstly, removal of the printed circuit from the solder bath frequently leaves solder icicles depending from the soldered terminals on the board, and leaves undesirable solder bridges interconnecting those terminals or conductive strips which are spaced relatively close together. The removal of these defects, which is usually essential to reliable operation of the printed circuit, must be accomplished manually by a skilled operator with a soldering iron and materially increases the cost of the completed unit. Secondly, the solder bath will frequently create solder joints which appear sound and reliable from the reverse side of the board, but which include only a very small amount of solder interconnecting the component lead to the associated printed circuit conductor owing to the fact that the solder has not completely filled the conductive terminal aperture through which the component lead passes.

The detection and correction of this form of defect is also obviously both a necessary and time-consuming operation.

Still another limitation inherent in the process of dip-soldering as practiced by the prior art is the fact that the heat from the solder bath limits the choice of insulative material from which the board may be fabricated. Moreover, the heat from the solder bath also will frequently destroy or render unreliable certain heat-sensitive electronic components, such as crystal rectifiers and transistors, which are mounted on the front of the printed circuit board.

Finally, the process of dip-soldering employed in the prior art will invariably deposit solder not only at the conductive terminals in the board where the electronic component lead wires terminate, but also on the printed circuit conductors interconnecting these terminals on the reverse side of the board. While a solder deposit on these conductors is not harmful per se, the solder so deposited on all of the printed circuits employed in a complex electronic system will materially increase the weight of the overall system without contributing in any manner to improved performance. In such applications as in airborne electronic systems, therefore, it is obviously desirable to eliminate this excess solder.

The present invention, on the other hand, provides methods and apparatus for dip-soldering printed circuits which eliminate the above and other disadvantage inherent in the prior art dip-soldering techniques. In accordance with the basic concept of the present invention the reverse side of a printed circuit board which is to be dip-soldered is first masked with an adhesive backed foil sheet having apertures therein corresponding to the terminals on the board which are to be soldered, the foil sheet being applied to and intimately bonded against the reverse side of the printed circuit board by the adhesive in a manner such that the apertures in the foil sheet register with and leave exposed the terminals to which solder is to be applied. After the electronic components have been mounted on the front of the printed circuit board in the customary manner, the masked reverse side thereof is dip-soldered, and the masking foil is then removed to complete the dip-soldering operation.

More particularly, in accordance with the invention the adhesive backed foil sheet employed for masking the printed circuit board is formed from a metal which solder does not wet, such as aluminum or stainless steel, for example, and is backed with an adhesive which will assure an intimate bond between the foil and printed circuit board while nevertheless permitting the foil to be removed easily subsequent to the dip-soldering operation. After being cut to a size consistent with the size of the printed circuit board with which it is to be used, each masking sheet is then apertured at selected points, as with a punching die for example, to provide an aperture pattern which registers with the pattern of the terminals to be soldered on the reverse side of the circuit board.

In practice it has been found that masking printed circuit boards in the aforesaid manner produces far more reliable solder joints, prevents the formation of solder icicles on the solder joints, and eliminates completely the formation of solder bridges between adjacent conductors or terminals on the circuit board. Moreover, it has been found that the step of dip-soldering the circuit board may be accomplished more quickly without injury to any temperature-sensitive components mounted on the front of the board, and with the use of considerably less solder owing to the fact that the terminal-interconnecting conductors are masked from the solder bath.

It is, therefore, an object of the invention to provide methods and apparatus for improving the quality of soldered joints produced by dip-soldering printed circuit boards.

It is also an object of the invention to provide methods and apparatus for masking printed circuit boards prior to dip-soldering so that only terminals to which solder should be applied are exposed to the solder bath.

Another object of the invention is to provide methods and apparatus for protecting heat-sensitive electronic components when the printed circuit board on which they are mounted is being dip-soldered.

A further object of the invention is to provide methods and apparatus for reducing the weight of dip-soldered printed circuit boards by restricting the areas to which solder is applied.

Still another object of the invention is to provide methods and apparatus for eliminating solder icicles and solder bridges on dip-soldered printed circuit boards.

The novel features which are believed to be characteristic of the invention, both as to its organization and method of operation, together with further objects and advantages thereof, will be better understood from the following description considered in connection with the accompanying drawing in which one embodiment of the invention is illustrated by way of example. It is to be expressly understood, however, that the drawing is for the purpose of illustration and description only, and is not intended as a definition of the limits of the invention.

Figure 1:
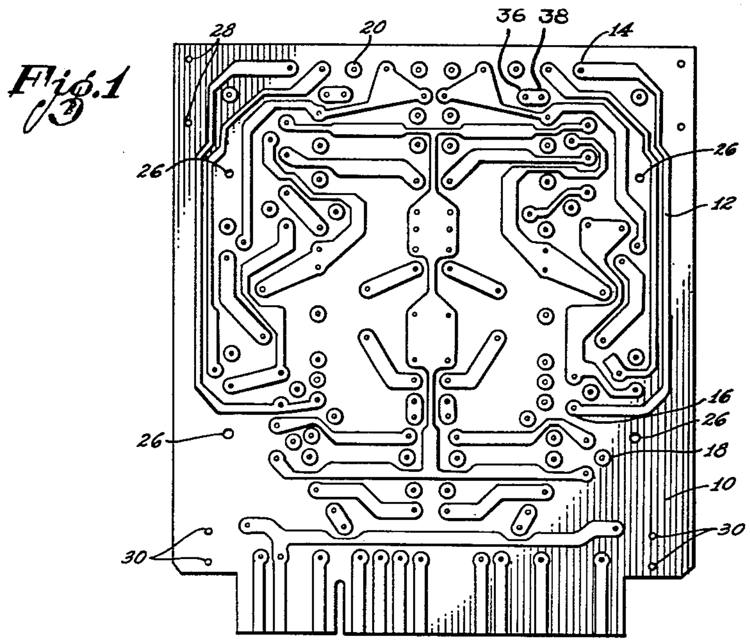
FIG. 1 is a plan view of the reverse side of a typical printed circuit board.

With reference now to the drawing, wherein like or corresponding parts are designated by the same reference characters throughout the several views, there is shown in FIG. 1 a plan view of the reverse side of a printed circuit board of the general type with which the methods and apparatus of the present invention are intended to be employed. As shown in FIG. 1 the printed circuit board comprises a sheet 10 of insulating material having an electrically conductive pattern on the surface thereof, a different conductive pattern, not here shown, being affixed to the front surface of sheet 10.

The printed circuit board may be fabricated in accordance with any of the several different printed circuit techniques known to the prior art. In general most of these techniques employ as a starting blank a sheet of insulating material to the opposite surfaces of which a foil sheet of a good conductor, such as copper, has been bonded, the desired conductive patterns being formed by selectively etching away portions of these conductive foils. More particularly, the blanks from which the printed circuit are formed usually employ either a phenolic resin or an epoxy base glass laminate as an insulating base to which conductive foil sheets are bonded. The desired patterns are then formed on the opposing surfaces of the starting blank by protecting those regions of the foil where conductors or terminals are desired, as with an etch resist, and then selectively etching away the unprotected areas of the foil.

Returning now to the description of FIG. 1, the conductive pattern on each side of the printed circuit board includes three different types of electrical elements. Firstly there are electrical conductors, such as conductor 12 for example, which electrically interconnect two or more terminals such as terminals 14 and 16, the terminals being apertured to receive the lead wires of electrical components mounted on the front of the printed circuit board. Secondly, the conductive pattern on each side of the board also includes apparently isolated electrical terminals, such as terminals 18 and 20, which are actually connected to electrical conductors on the front side of the board, not here shown. Finally, the conductive pattern includes a plurality of parallel connector strips, such as strips 22 and 24 for example, which are connected at one end to one or more electrical terminals, the other of each of these strips terminating at the bottom of the board. In operation these connector strips function as electrical input and output connectors for the electrical circuit mounted on the printed circuit board by providing contact surfaces for the contacts of an associated printed circuit connector plug into which the bottom edge of the printed circuit board, as viewed in FIG. 1, is inserted.

Considering now the details of the various terminals on the printed circuit board, each terminal includes an apertured conductor extending through the printed circuit board and terminating as part of the conductive pattern on the front side of the board. In accordance with the standard practices followed in the printed circuit art, these apertured conductors are usually formed either by swaged eyelets which are fastened in holes drilled in the printed circuit board, or by plating a conductive film on the surface of a hole drilled through the board, the terminals fashioned according to this latter process being generally known in the art as plated-through-holes. Regardless of the manner in which they are formed, however, it is the function of the completed terminals to receive the lead wires from the associated electrical components mounted on the front of the board so that the components may be interconnected, as by soldering their lead wires to the associated terminals, to provide the desired electronic circuit.

In accordance with the present invention the process whereby the components are soldered to the printed circuit board is greatly facilitated by first masking the reverse side of the printed circuit board so that only the terminals to be soldered are exposed, and then dip-soldering the board by placing the board on the surface of a solder bath to produce all of the desired solder connections in one operation. In order to most clearly understand the manner in which the methods of the invention are carried out and the advantages which are achieved thereby, the various steps involved in the manufacture of a completed printed circuit will now be described.

Assuming that the printed circuit board shown in FIG. 1 has been completely fabricated and is ready for use by production personnel, any hardware deemed necessary for either holding components on the front side thereof or for engaging the printed circuit connector plug should first be mounted on the board in apertures provided therefor. For example, the particular printed circuit board shown in FIG. 1 includes four apertures designated 26 in which four transistor mounting clips may be swaged, four apertures designated 28 for mounting a handle with swage pins, and four apertures designated 30 for mounting guide lugs which are utilized for engaging the printed circuit connector plug when the completed printed circuit is placed in operation.

The transistor holding clips, of course, are mounted on the front of the board, while the handle and guide lugs may be mounted on either side thereof. For reasons which will be apparent from the ensuing description, however, it is preferable to mount all of the hardware on the front of the board so that only the swaged pins holding the hardware protrude from the reverse side of the board. The printed circuit board is then washed in a suitable detergent, rinsed, and dried in an oven to remove all foreign matter from the surface thereof. It will be appreciated of course that the board may be cleaned prior to mounting the aforementioned hardware thereon, provided that care is exercised to maintain the cleanliness of the board.

Figure 2:
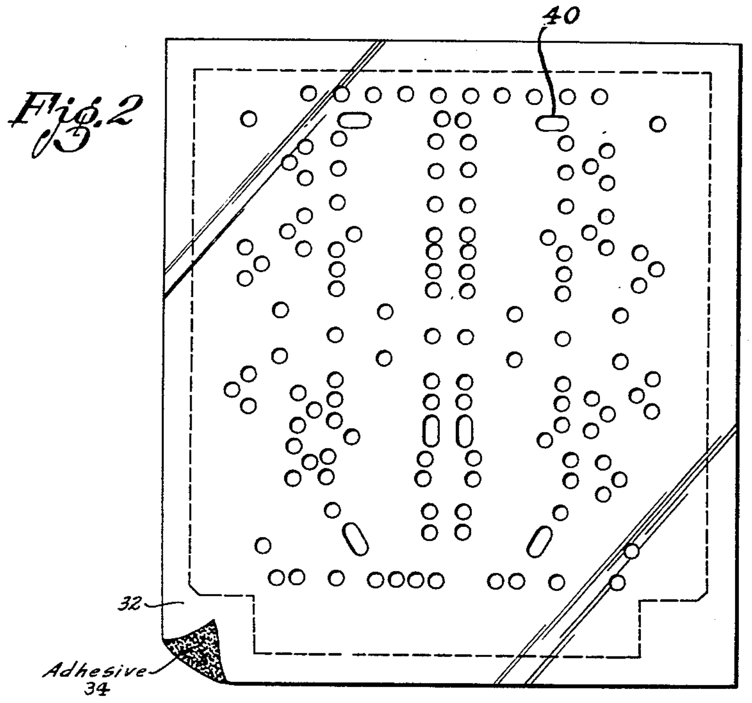
FIG. 2 is a plan view of an adhesive backed foil sheet which is employed for selectively masking the printed circuit board of FIG. 1, in accordance with the invention.

With reference now to FIG. 2, in accordance with the present invention the reverse side of the printed circuit board is now masked with a foil sheet 32 formed from a metal which is not wetted by solder, the foil sheet having an adhesive backing as shown at 34 so that the foil may be bonded directly to the printed circuit board. As further shown in FIG. 2 the foil sheet includes a plurality of apertures positioned relative to each other so that they register with and thereby leave exposed the terminals to be soldered on the printed circuit board.

Figure 3:
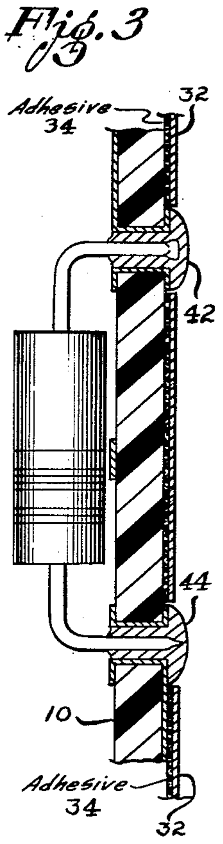
FIG. 3 is a sectional side view of a portion of the printed circuit board of FIG. 1 illustrating the manner in which the solder mask shown in FIG. 2 functions to improve the quality of the dip-soldered joints.

After the masking operation has been completed the various electronic components to be included in the printed circuit are mounted on the front of the printed circuit board, the conductors or lead wires of each component being passed through the particular terminals provided therefor and being clipped substantially flush with the reverse side of the board, as shown in FIG. 3. It should be noted from FIG. 3 that the leads are preferably clipped with a blunt-edged instrument, thereby flattening the end of the lead wire so that it is wider than the aperture in the associated terminal.

After the various components have been mounted on the printed circuit board, a liquid solder flux is then applied to the masked reverse side of the printed circuit board, as by brushing or flat dipping. One particular solder flux which has been employed in this operation is sold commercially under the trade name Formula No. 1547 Soldering Flux by the Kester Solder Co. of Chicago, Illinois. It is to be understood, however, that any other conventional solder flux employed in the printed circuit art may be utilized without departing from the invention.

Following the application of the solder flux the printed circuit is then dip-soldered by momentarily placing the masked reverse side of the circuit board on the surface of a solder bath, thereby soldering the component lead wires to their associated terminals. While the constituency of the solder bath is not considered to be critical, excellent results have been solder bath is not considered to be critical, excellent results have been obtained by employing a solder bath containing approximately 60% lead and 40% tin at a temperature between 500° F. and 525° F. For this particular solder bath a dipping period of between three to five seconds has been found to produce excellent solder joints without damage to any heat-sensitive electronic components, although an even shorter dipping period can be employed if the printed circuit board is masked in the manner herein taught. Following the dip-soldering step, the foil mask on the reverse side of the printed circuit is then removed after which the completed board is rinsed in a suitable flux remover, such as Kester AP 20 Flux Remover sold commercially by the aforementioned Kester Solder Co., to remove all traces of soldering flux from the board and thereby complete the manufacturing process.

Returning now to the description of FIG. 2, it will be recalled that one requirement of the metal foil employed in the solder mask is that it must not be wetted by solder. In addition, it will be appreciated that the metal foil should be relatively insoluble in solder to prevent contamination of the solder bath through repeated dip-soldering operations. The material which has been found to best satisfy this requirement economically is aluminum, although other materials such as austenitic stainless steel could also be employed satisfactorily in carrying out the method of the invention.

The thickness of the foil sheet employed in the solder mask, in turn, should fulfill two criteria. Firstly it must be sufficiently thin and have a sufficiently low temper to permit easy flexing of the foil so that the foil can be rolled or otherwise pressed against the printed circuit and bond intimately with both the base insulating material and any raised portions of the conductive pattern. On the other hand, the foil must be sufficiently thick to permit the mask to be readily stripped from the printed circuit board after the soldering operation has been completed. In general a thickness of between two to five thousandths of an inch will be found to satisfy the foregoing requirements when aluminum foil is utilized.

Considering next the adhesive backing on the foil masking sheet, the adhesive obviously must provide a good bond between the foil mask and both the insulating base and conductive elements on the printed circuit board, and be able to maintain this bond at relatively high temperatures. In addition, however, it should permit the foil mask to be removed readily after the circuit board has been dip-soldered, and should cling to the foil mask rather than to the circuit board when the mask is removed.

While a number of different types of adhesives have been found to satisfy the foregoing criteria with varying degrees of success, the best results have been obtained with rubber-based pressure sensitive adhesives and cellulose-based solvent activated adhesives. Aluminum foil backed with either of these types of adhesive are commercially available from such companies as Minnesota Mining and Manufacturing Company of Saint Paul, Minnesota, one particularly satisfactory masking foil employing a pressure sensitive adhesive backing being available in rolls from that company under the trade name Scotch Brand Pressure Sensitive Tape No. 425.

The apertures in the masking foil obviously may be provided by either punching each aperture individually, or by die punching all apertures simultaneously. Each aperture is preferably formed with a diameter slightly larger than the diameter of the terminal with which it is to register, while closely adjacent and interconnected terminals, such as terminals 36 and 38 in FIG. 1, may be exposed to the solder bath through a common aperture 40 in the masking foil, as shown in FIG. 2. It should be noted here that if a die is to be used for punching the apertures, the die may be produced by utilizing a photoreproduction of the original printed circuit artwork to provide accurate registration on the foil.

Returning now to FIG. 3, the masking process herein disclosed has been found to eliminate completely solder bridges linking adjacent terminals or contiguous conductors, and to substantially decrease the amount of solder used per circuit while concomitantly providing a lighter finished product. While it is apparent how these advantages are achieved by the masking process, it has been discovered that there are also other significant advantages provided thereby which are not so readily explained.

More specifically, the masking process has been found to substantially eliminate the formation of solder icicles on the soldered terminals and to leave a rounded button of solder as illustrated in FIG. 3 by the buttons 42 and 44. This latter phenomenon is attributed to the fact that the soldered terminals are completely surrounded by the solder repellent masking foil, although the precise reason why this inhibits the formation of solder icicles is not known. Suffice it to say that heretofore no techniques known to the art have been adequate to eliminate the icicle problem, even on isolated terminals such as terminals 18 and 20 in FIG. 2.

Still another significant advantage gained by practicing the masking process of the present invention is that the solder is found to completely fill the apertured terminals in the printed circuit board, as shown in FIG. 3, despite the fact that the printed circuit board is only held in the solder bath on the order of half the interval required in the prior art methods. Again the reason for this phenomenon is not precisely known, although it is believed that the solder repelling characteristics of the masking foil aid in forcing the solder into the terminals by virtue of the very low contact angle of the solder to the foil. In addition, the decrease in dip-soldering time attendant the practice of the present invention, combined with the heat barrier provided by the adhesive backed masking foil, have been found to eliminate substantially any injury to such heat-sensitive electronic components as crystal-rectifiers and transistors.

It is to be expressly understood, of course, that the foregoing description of the methods and apparatus of the invention is merely illustrative and that the invention may be practiced in manners different from that described hereinabove. For example, although it is preferable to perform the masking operation before mounting the electronic components on the front of the printed circuit board, it will be recognized that these steps may be performed in inverse order if desired, provided care is exercised not to displace the component lead wires while masking the board. Accordingly the scope of the invention should be limited only by the spirit and scope of the appended claims.

What is claimed as new is:

1. In the process of manufacturing a printed circuit, the method of soldering component lead wires to associated apertured terminals interconnecting the electrically conductive patterns on the opposite sides of a printed circuit board, said method comprising the steps of: selectively masking one side of the printed circuit board with an adhesively secured, closely adherent solder-repellant metallic foil to leave exposed only the terminals which are to be soldered; mounting the electrical components on the opposite side of the board by passing the lead wires thereof through the associated aperture terminals; and placing the masked side of the board momentarily on the surface of a bath of molten solder.

2. The method defined in claim 1 which further includes the steps of applying a liquid solder flux to the masked side of the printed circuit board before placing the board in the solder bath, and removing the masking foil from said one side of the board after the board has been withdrawn from the solder bath.

3. The method defined in claim 2 which includes the additional step of rinsing the printed circuit board in a liquid solder flux remover after the foil mask has been removed from the board.

4. In the process of producing a printed circuit wherein the lead wires of a plurality of electronic components mounted on one side of a printed circuit board are electrically connected to a plurality of associated apertured terminals extending through the board, the combination of steps comprising: selectively masking the other side of the printed circuit board with an adhesively secured, closely adherent metallic foil which is unwetted by solder to leave exposed the terminals to which lead wires are to be electrically connected; applying a liquid solder flux to the masked side of the printed circuit board; and placing the masked side of the printed circuit board in contact with the surface of a pool of molten solder to solder the exposed terminals to their associated component lead wires.

5. In the method of producing a printed circuit wherein the lead wires from a plurality of electrical components mounted on one side of a printed circuit board are soldered to associated terminals extending through the board, the combination of steps comprising: depositing an adhesive backing on one side of a sheet of aluminum foil; punching a plurality of apertures in said foil at relative locations corresponding to the relative positions of the terminals on the other side of the board to which the lead wires are to be soldered; and applying the adhesive backed foil to the other side of the printed circuit board so that the apertures therein register with the corresponding terminals on the back of the board.

6. A removable dip-soldering mask for use in soldering simultaneously a plurality of electronic components to a printed circuit board having conductive patterns on opposite sides thereof interconnected by a plurality of apertured conductive terminals, said components being mounted on one side of said board by conductive lead wires extending through the apertures in said terminals, said mask comprising: a sheet of solder repellent metal foil for application to the other side of said printed circuit board, said foil including a plurality of apertures therein adapted to register with the apertured terminals in said board when said foil is applied thereto; and an adhesive layer affixed to one side of said foil sheet for bonding said foil sheet to said other side of said board, said adhesive layer having a greater affinity for said foil sheet than to said board and the conductive pattern on said other side thereof.

7. The mask defined in claim 6 wherein said foil is composed essentially of aluminum and said adhesive layer is composed of a rubber-based pressure sensitive adhesive.

8. The mask defined in claim 7 wherein the thickness of said aluminum foil is within the range from two to five thousandths of an inch.

9. A removable dip-soldering mask for use in soldering simultaneously a plurality of electronic components to a printed circuit board having conductive patterns on opposite sides thereof interconnected by a plurality of apertured conductive terminals, said components being mounted on one side of said board by conductive lead wires extending through the apertures in said terminals, said mask comprising: a sheet of solder repellent metal foil for application to the other side of said printed circuit board, said sheet having a plurality of holes established therein in registry with said plurality of apertured terminals; and a layer of pressure sensitive adhesive established on one surface of said sheet, said adhesive layer having greater adhesion to said sheet than to said board whereby said sheet will bond to said one side of said board as a mask leaving exposed only said terminals during dip soldering of said board, and may be stripped subsequently from the board without substantial deposition of adhesive thereon.

10. For use with a printed circuit board having a plurality of conductive terminals extending therethrough and a plurality of metallic film conductors bonded to at least one side thereof, expendable masking means for application to said one surface to permit adherence of solder to said terminals and to repel solder from said conductors when said one surface is dipped in solder, said masking means comprising: a sheet of aluminum foil for application to said one surface, said sheet of foil having a plurality of holes punched therethrough corresponding in position to the relative positions of said plurality of terminals; and an adhesive layer deposited on one side of said sheet of foil to permit said sheet of aluminum foil to be adhesively applied to said one surface of said board to selectively expose only said terminals to the action of solder.

11. In combination: a printed circuit board comprising an insulating board having conductive film patterns bonded to opposite sides thereof and conductive apertured terminals extending therethrough; a plurality of electrical components mounted on one side of said board and having a plurality of conductive lead wires extending into the apertures in said terminals; and an expendable removable dip-soldering mask affixed to the other side of said board to facilitate soldering of said lead wires to said terminals, said mask comprising a sheet of aluminum foil having one surface thereof coated with adhesive, said sheet being applied to said one side of said board with said one surface in adherent contact with said one side, said sheet having a plurality of holes therein in registry with said plurality of terminals.

12. In combination: a printed circuit board comprising an insulating board having first and second sides, a plurality of apertured terminals extending through said board, and a plurality of film conductors bonded to at least one side of said board and connected to said terminals; and an expendable apertured foil solder mask adhesively applied to said one side of said printed circuit board, the apertures in said mask registering with the terminals in said board, said mask comprising a sheet of aluminum foil backed with an adhesive having a greater affinity for said foil than for said insulating board and said film conductors.

13. In the process of manufacturing a printed circuit, the method of soldering component lead wires to associated apertured terminals interconnecting the electrically conductive patterns on the opposite sides of a printed circuit board, said method comprising the steps of: foil masking one side of the printed circuit board with closely adherent, adhesively secured solder-repellant metallic material to leave exposed only the terminals which are to be soldered; mounting the electrical components on the opposite side of the board by passing the lead wires thereof through the associated apertured terminals; and placing the masked side of the board momentarily on the surface of a bath of molten solder.

References Cited in the file of this patent

UNITED STATES PATENTS

| | | |
|---|---|---|
| 1,503,991 | Moecker | Aug. 5, 1924 |
| 2,106,133 | Goldman | Jan. 18, 1938 |
| 2,326,022 | Everett | Aug. 3, 1943 |
| 2,506,047 | Thomas | May 2, 1950 |
| 2,582,685 | Eisler | Jan. 15, 1952 |
| 2,695,351 | Beck | Nov. 23, 1954 |
| 2,740,193 | Pessel | Apr. 3, 1956 |
| 2,865,093 | Ingram | Dec. 23, 1958 |
| 2,885,601 | Pessel | May 5, 1959 |
| 2,916,805 | Plesser | Dec. 15, 1959 |

OTHER REFERENCES

Webster's New International Dictionary, second edition, G. & C. Merriam Company, Publisher, Springfield, Mass., 1938.

Electrical Manufacturing, volume 52, July 1953, pages 101–108.